United States Patent
Laurence et al.

(10) Patent No.: US 7,171,644 B1
(45) Date of Patent: Jan. 30, 2007

(54) IMPLEMENTATION SET-BASED GUIDE ENGINE AND METHOD OF IMPLEMENTING A CIRCUIT DESIGN

(75) Inventors: John J. Laurence, Westminster, CO (US); Daniel J. Downs, Longmont, CO (US); Raymond Kong, San Francisco, CA (US); Richard Yachyang Sun, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 150 days.

(21) Appl. No.: 10/912,957

(22) Filed: Aug. 6, 2004

(51) Int. Cl.
*G06F 17/50* (2006.01)

(52) U.S. Cl. .......................................... 716/18; 716/2
(58) Field of Classification Search ................ 716/18, 716/2
See application file for complete search history.

(56) References Cited

U.S. PATENT DOCUMENTS

| | | | |
|---|---|---|---|
| 5,867,396 A | | 2/1999 | Parlour |
| 5,870,308 A | * | 2/1999 | Dangelo et al. ............ 716/18 |
| 6,026,226 A | * | 2/2000 | Heile et al. ................ 716/12 |
| 6,408,428 B1 | * | 6/2002 | Schlansker et al. ......... 716/17 |
| 6,490,717 B1 | | 12/2002 | Pedersen et al. |
| 6,539,533 B1 | | 3/2003 | Brown, III et al. |
| 6,574,788 B1 | | 6/2003 | Levine et al. |
| 6,625,797 B1 | * | 9/2003 | Edwards et al. ............ 716/18 |
| 6,854,096 B2 | * | 2/2005 | Eaton et al. ................. 716/2 |
| 2002/0016952 A1 | | 2/2002 | Chang et al. |
| 2004/0098689 A1 | | 5/2004 | Weed |
| 2004/0225972 A1 | | 11/2004 | Oeltjen et al. |
| 2005/0114818 A1 | | 5/2005 | Khakzadi et al. |
| 2005/0149898 A1 | | 7/2005 | Hakewill et al. |

OTHER PUBLICATIONS

U.S. Appl. No. 10/273,448, filed Oct. 17, 2002, Anderson.
U.S. Appl. No. 10/812,550, filed Mar. 29, 2004, Aggarwal et al.
U.S. Appl. No. 10/912,999, Aug. 6, 2004, Sun et al.
U.S. Appl. No. 10/913,000, Aug. 6, 2004, Kong et al.
U.S. Appl. No. 10/913,746, Aug. 6, 2004, Downs et al.
U.S. Appl. No. 10/913,752, Aug. 6, 2004, Downs et al.
"Development System Reference Guide" from Xilinx Inc, 2100 Logic Drive, San Jose, Ca. 95124, Copyright 1994-2003, which has Web address http:/ /toolbox.xilinx.com/docsan/xilinx6/books/data/docs/dev/dev0001$_{13}$ 1.html.

(Continued)

*Primary Examiner*—Jack Chiang
*Assistant Examiner*—Binh Tat
(74) *Attorney, Agent, or Firm*—Pablo Meles; LeRoy D. Maunu

(57) ABSTRACT

A method of implementing an integrated circuit design can include the steps of forming a base implementation set and forming a guide implementation set having a plurality of guide implementation set nodes. The method can further include the steps of depositing directives on at least one guide implementation set node (or each node) among the plurality of guide implementation set nodes. The method can further include the steps of creating and depositing tasks on at least one guide implementation set node (or each node) among the plurality of guide implementation set nodes. The method can further include the steps of invoking each task deposited on guide implementation set nodes as each node in the guide implementation set tree is visited.

13 Claims, 11 Drawing Sheets

OTHER PUBLICATIONS

"Constraints Guide", ISE 6.1i from Xilinx Inc., 2100 Logic Drive, San Jose, CA. 95124, Copyright 1994-2003, which has Web address http://toolbox.xilinx.com/docsan/xilinx6/books/data/docs/cgd/cgd0001_1.html).

Xilinx Inc.; "Guided Mapping"; from Xilinx Inc., 2100 Logic Drive, San Jose, California 95124, downloaded from http://toolbox.xilinx.com/docsan/xilinx5/data/docs/dev/dev0058_12.html#wp998922; pp. 1-2, unvailable.

Xilinx, Inc.; "Incremental Design Overview"; from Xilinx Inc., 2100 Logic Drive, San Jose, California 95124, downloaded from http://toolbox.xilinx.com/docsan/xilinx5/data/dev/dev0018_7.html#wp1002643; pp. 1.

Xilinx, Inc.; "Modular Design Overview"; from Xilinx Inc., 2100 Logic Drive, San Jose, California 95124, downloaded from http://toolbox.xilinx.com/docsan/xilinx5/data/docs/dev/dev0022_8.html#wp998426; pp. 1-2, unvailable.

Xilinx, Inc.; "Modular Design Tips"; from Xilinx Inc., 2100 Logic Drive, San Jose, California 95124, downloaded from http://toolbox.xilinx.com/docsan/xilinx5/data/docs/dev/dev0028_8.html#wp1010217; pp. 1-5, unvailable.

Xilinx, Inc.; "Running the Sequential Modular Design Flow"; from Xilinx Inc., 2100 Logic Drive, San Jose, California 95124, downloaded from http://toolbox.xilinx.com/docsan/xilinx5/data/docs/dev/dev0027_8.html#wp999993; pp. 1-5, unvailable.

* cited by examiner

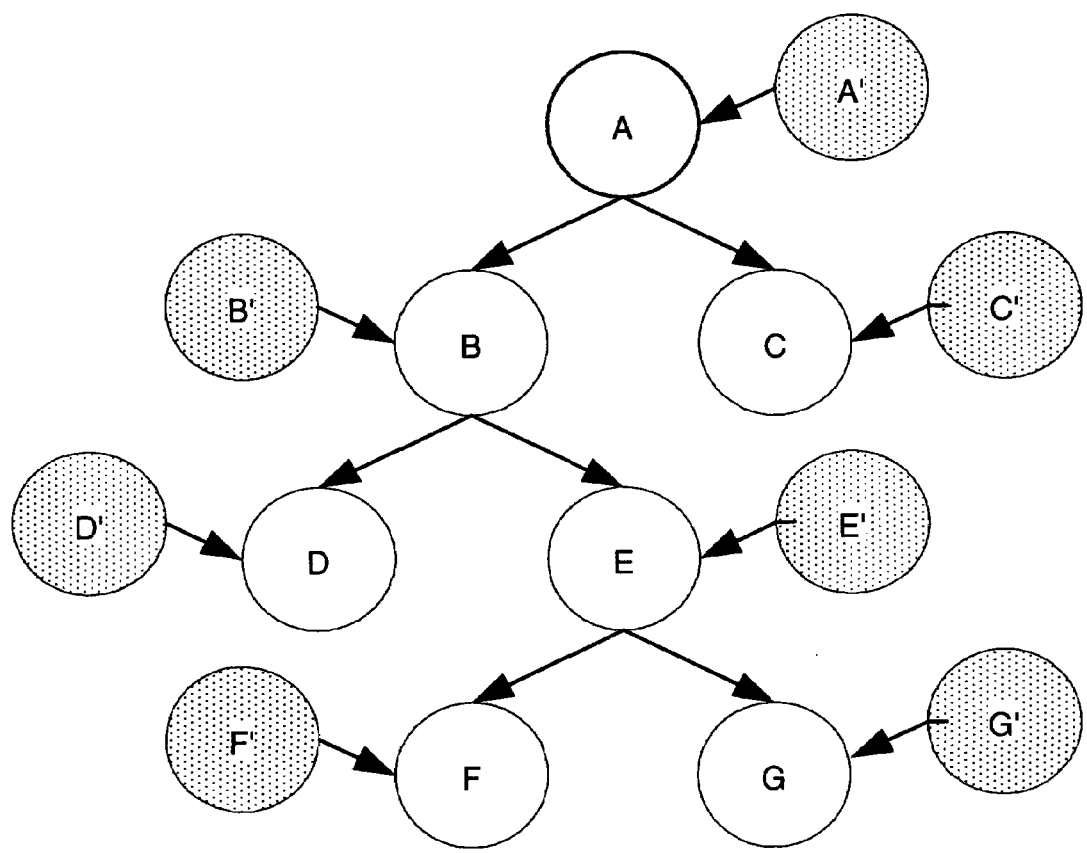
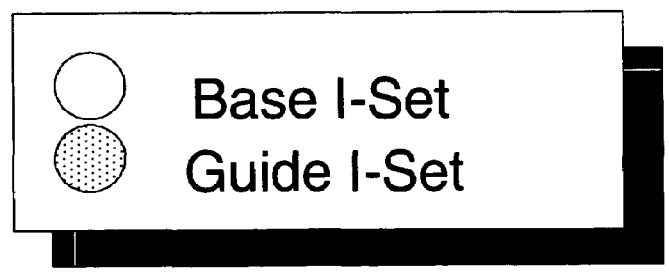
FIG. 5

First Design 300

IMPLEMENTATION SET-BASED GUIDE ENGINE AND METHOD OF IMPLEMENTING A CIRCUIT DESIGN

CROSS-REFERENCE TO RELATED APPLICATIONS

The following commonly assigned applications, filed concurrently herewith, are hereby incorporated by reference:

1. METHOD AND SYSTEM FOR DESIGNING INTEGRATED CIRCUITS USING IMPLEMENTATION DIRECTIVES, by Daniel J. Downs et al.

2. METHOD AND SYSTEM FOR IMPLEMENTING A CIRCUIT DESIGN IN A TREE REPRESENTATION, by Richard Y. Sun et al.

BACKGROUND

1. Field of the Invention

The invention relates to the field of physical circuit design and, more particularly, to a method and system of guiding grouped logic used when implementing a circuit design.

2. Description of the Related Art

Circuit designs, and particularly designs for Field Programmable Gate Arrays (FPGA's), have become increasingly complex and heterogeneous. The rapid increase of FPGA design complexity and size has driven several complex Xilinx FPGA devices to accommodate a few million gates. Modern circuit designs can include a variety of different components or resources including, but not limited to, registers, block Random Access Memory (RAM), multipliers, processors, and the like. This increasing complexity makes design tools, maintenance of design tools as well as placement and signal routing of circuit designs more cumbersome. Existing design tools can have multiple flows that fail to be uniform, further adding to the complexity in the tools and their maintenance. Furthermore, existing design tools fail to provide sufficient flexibility in terms of representing design granularity in a particular design.

Xilinx software implementation tools currently support a number of user flows including a "conventional flow" and a set of "user interactive" flows. The conventional flow is characterized by a single design iteration while the user interactive flows require two (2) or more design iterations through the tools. These user interactive flows refer to a collection of five(5) flows, namely Normal Guide Exact flow, Normal Guide Leverage flow, Incremental Design flow, Modular Design flow, and Partial Reconfiguration flow. Each flow addresses a specific set of customer needs. Note, Xilinx software implementation tools can support other types of conventional flows as well.

The Conventional Flow consists of the Normal Guide Exact Flow and the Normal Guide Leverage Flow. For Normal Guide Exact and Leverage flows, their primary use is to incorporate design changes based upon a previous physical implementation where the underlying objective is to incorporate the changes while preserving the performance of the previous implementation. When the Normal Guide Leverage flow is selected, the primary goal is to use the results as a starting point for the overall implementation. As for Incremental Design flow, its primary application is to incorporate and implement design changes to an existing design. However, the objective for Normal Guide Leverage and Incremental Design flow is to minimize the overall implementation run-time. For Modular Design flow, it serves two primary use cases, namely: (1) to provide a software infrastructure that allows for a divide-and-conquer approach used to manage design complexity by tackling smaller sub-designs; and (2) to provide a software infrastructure to support a parallel team design environment where a single design is divided into sub-designs. In turn, each partitioned sub-design can be implemented independently by different team members. The final design is then assembled from previously implemented sub-designs. Lastly, the Partial Reconfiguration flow takes advantage of the underlying Xilinx FPGA device feature of partial bit stream re-programming which allows for the loading of a partial bit stream onto a Xilinx FPGA device while it is active and operational on the unchanged bit stream portion. From an implementation perspective, the Partial Reconfiguration flow is supported as a sub-flow or a variation of the Modular Design flow.

Due to historical reasons, each of the user interactive flows has been designed separately and for the most part defect driven. The evolution of these flows has taken separate and independent paths. Without a common theme among these user interactive flows, it was inevitable that the relevant concepts, methodology, and implementation became fractured. As a result, inefficiencies arose and customer flow complexity increased. Each interactive flow required a different set of knowledge, terminology, and procedure that posed as an obstacle to ease-of-use. In addition, the internal implementation increased in the development overhead as each user interactive flow was supported separately.

One of the root causes identified for why the prior interactive flows diverged was that each interactive flow operated on a different notion or implementation of how a partial net-list is specified. Specifically, under Incremental Design flow, the partial net-list of interest is specified by the contents of an Area Group. Similarly, under Modular Design and Partial Reconfiguration flows, the partial net-list is specified by either an Active Module or a previously implemented module (or PIM). Lastly, under Normal Guide Exact, Leverage, and other conventional flows, the partial net-list is given by the entire design. As the result, the client application implementations became dependent of each flow and required the software overhead of understanding and processing the various data representations. In addition, due to the complexity of each interactive flow, the software maintenance and enhancements became an increasing overhead and burden on engineering staff resources. Furthermore, there were other notions of partial net-lists in the software system such as: modules, hard macro, and soft IP core. Each of these design entities were implemented and supported separately. As the software system evolves with an increasing number of these design entities, the resulting software complexity and impact will be significant. For simplicity, Area Groups or user floor-planned partitioning, Active Modules, Inactive Modules, PIMs, hard macros, soft IP cores, and RPMs will be collectively referred to hereinafter as net-list entities.

Many of the tasks performed in these interactive flows relate to working with containers of grouped logic. Flows are determined in part by user specified command line parameters and user-specified constraints. Client software such as point tools read the parameters from the command line and the constraint file, and operate on the groups of logic with algorithms that are dependent on the particular flow that is being followed. The algorithms are fractured and branch into other algorithms depending on characteristics such as the flow information and the additional parameters that defines the grouped logic. As noted above, changes to the flow definition may require extensive modification to underlying algorithms.

In existing systems, individual point tools would use flow information to change the behavior of algorithms. For example, a tool may need to know if it should guide all of a container of logic, or none of it. The tool would determine the flow, and perhaps not guide the container if it had a change to the logic and it was in the Incremental Design flow. In other words, flow information was interspersed widely throughout the point tools' algorithms. For instance, in the Modular Design flow, Place and Route tools read data from the command line, but the existence of Active Modules in the design database would invoke a different algorithm than was originally being processed. The distributed nature of flow information throughout the algorithms has many disadvantages. A specified flow is a very high level concept that affects many low-level decisions. Any changes to the high-level flow information will result in changes to the code in many different places that can result in costly coding errors. Relatively minor changes to the flow can result in major modifications to the underlying algorithms. Consequently, it is difficult to support new flows or modify existing flows. Changes in behavior cannot be achieved globally with existing systems. All code in each client based upon the behavior would consequently need to be modified or otherwise significant bugs would be introduced and likely propagate.

Due to historical reasons, each "user-interactive" flow was designed and supported in the "Physical Guide" application as separate entities. Each entity was flow dependent. The development overhead was increasing in complexity as support for existing and new interactive flows were introduced. Subsequently, each flow required a different set of knowledge, terminology, and procedures to complete correctly thus increasing development overhead resulting in a decrease in reliability in the Physical Guide application.

SUMMARY OF THE INVENTION

The notion of Implementation Set (I-Set) along with directives is being introduced to provide a common and singular paradigm for which all interactive flows can operate upon. I-Sets along with the directives provide a flow independent concept to how a partial net-list is specified. In other words, embodiments in accordance with the invention removes dependencies between high-level flow requirements and low-level tasks as it relates to the electronic design process for integrated circuits. By providing a unifying data model such as I-Set, client applications can significantly simplify their interface to the underlying net-list information. Effectively, client applications no longer need to distinguish between different net-list entities such as area groups, modules, and flat designs in its implementation. Client applications such as design implementation tools can focus solely on I-Sets and basic implementation directives can be derived from the decomposition of high-level flow information and be associated with partial net-lists. A software tool can be used to determine a list of (flow independent) tasks needed to manipulate the containers. A generic interface can be used to process any given flow, regardless of complexity, by leveraging from Implementation Set (I-Sets) directives. Embodiments in accordance with the present invention can include software programs that implement IC designs such as PLD, ASIC, and gate array design implementations.

In a first embodiment in accordance with the present invention, a method of implementing an integrated circuit design can include the steps of forming a base implementation set and forming a guide implementation set having a plurality of guide implementation set nodes. The method further includes the step of depositing directives and guide related characteristics on at least one guide implementation set node (or each node) among the plurality of guide implementation set nodes. The method further includes the step of depositing flow independent tasks determined from the interpretation of the implementation directives on at least one guide implementation set node (or each node) among a plurality of guide implementation set nodes. The method can further include the step of invoking each flow independent task deposited on guide implementation set nodes as each node in the guide implementation set tree is visited. The plurality of guide implementation set nodes can be traversed in a hierarchical fashion (bottom-up or top-down) as well as in a non-hierarchical fashion. Also, existing flow behaviors can be changed by adding, changing, or depositing different directives. A common function interface can be used to support a plurality of tasks or directives. More particularly, a plurality of directives associated with each of the plurality of guide implementation set nodes can be mapped to a generic interface independent of prescribed flows.

In a second aspect, a method of implementing an integrated circuit design can include the steps of forming a plurality of implementation sets, each implementation set in the plurality containing net-list logic in a user design hierarchy and mapping a plurality of directives associated with each of the plurality of implementation sets to a generic interface which can be independent of prescribed flows. The method can further include the step of depositing directives and guide related characteristics on at least one guide implementation set node among a plurality of guide implementation set nodes associated with the plurality of implementation sets. The method further includes the step of depositing flow independent tasks determined from the interpretation of the implementation directives on at least one guide implementation set node (or each node) among a plurality of guide implementation set nodes. The method can further include the step of invoking each flow independent task deposited on guide implementation sets nodes as each node in the guide implementation set tree is visited.

In a third aspect of the present invention, an implementation set based guide engine that can map a base implementation set to a guide implementation set comprises a guide implementation set having a plurality of guide implementation set nodes associated with a base implementation set and a generic and flow independent interface to the guide implementation set having a set of guided implementation set recipes enabling the interpretation of directives deposited on the guide implementation set nodes independent of design entities. The directives, guide related characteristics, and flow independent tasks can be deposited on at least one guide implementation set node or each guide implementation set node among the plurality of guide implementation set nodes. Also note that each task deposited on guide implementation sets nodes can be invoked as each node in the guide implementation set is visited.

Other embodiments of the present invention, when configured in accordance with the inventive arrangements disclosed herein, can include a system for performing, and a machine readable storage for causing a machine to perform, the various processes disclosed herein.

BRIEF DESCRIPTION OF THE DRAWINGS

There are shown in the drawings, embodiments which are presently preferred, it being understood, however, that the invention is not limited to the precise arrangements and instrumentalities shown.

FIG. 5 is an illustration of a physical guide engine I-Set tree in accordance with an embodiment of the present invention.

DETAILED DESCRIPTION OF THE INVENTION

Figure 1:
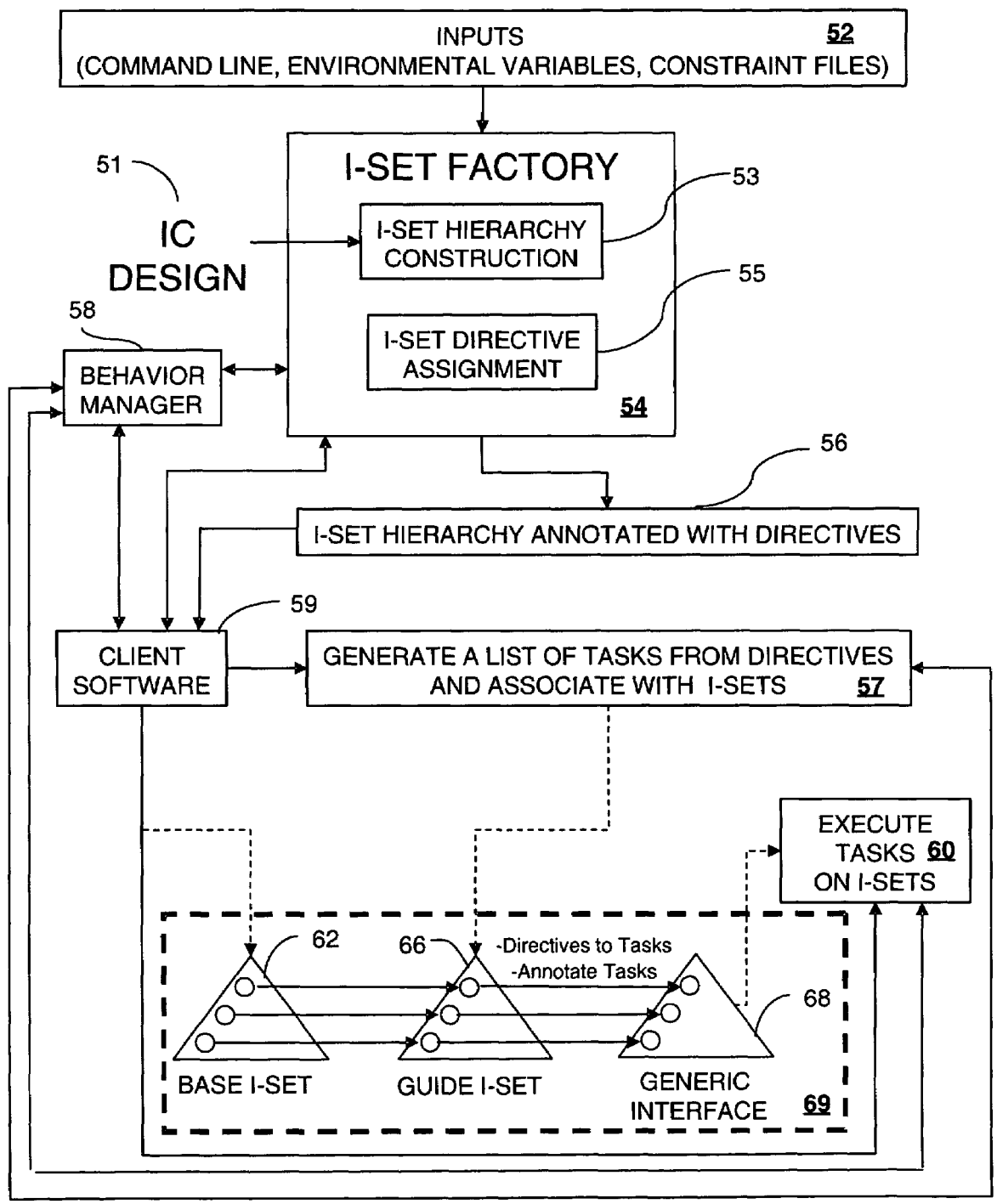
FIG. 1 is a flow chart illustrating the overall creating and use of I-Sets in circuit designs along with client software such as circuit design tools in accordance with the one embodiment of the present invention.

The present invention provides a solution for simplifying the implementation of circuit designs and associated maintenance without limiting or restricting granularity by using an abstraction called implementation sets or I-Sets along with an I-Set based guide engine system and method. An I-Set can be an abstraction that contains and/or references all necessary design information to implement a specific portion of a single design or a sub-design. In other words, an I-Set can be considered a container of net-list logic that can include either a portion of a design or an entire design. Without loss of generality, the sub-design may represent a single design in its entirety. An I-Set has several important aspects including partial net list information, implementation directives and client specific data and software objects (i.e.: tasks).

More particularly, a Guide application (or engine) in accordance with an embodiment of the present invention operates on or is a client of data structures such as I-Sets (and manipulates I-Sets) much like the guide engine is a client of a Behavior Manager (further detailed below). Generally, a data driven method in accordance with embodiments herein enables a Guide application (or other clients (i.e.: point tools)) to create special views of the I-Set tree. The special views of the I-Set tree can be referred to as the Guide I-Set in the Guide application. The data driven method can also include a Guide I-Set Factory that deposits directives on I-Set nodes. A particular combination of operation directions defines an interactive flow. Furthermore, this data driven method or Guide application has a unified implementation where no high level flow specific data is included in any tasks. The behavior of what the guide engine does can be controlled by simply depositing flow independent tasks on I-Set nodes. This method allows the Guide algorithms to access the behavior manager to determine how to operate on the data that it is processing. Note, it is not a requirement to have a guide implementation set. A point tool could deposit directives on a base I-set and operate solely in that context.

Before any further discussion of the system of managing behavior or a behavior manager, a few explanation of terms can aid in understanding several of the embodiments discussed herein:

A client is a software entity such as a point tool. Grouped Logic is a collection of logic, usually (but not always) related in some way. The collection of logic can be defined by a user defined constraint (Area Group) or internally by software tools (I-Sets). Implementation Directives are user and tool rules that serve as guidelines for how client software and algorithms should operate. A behavior is a low-level, easily defined action related to a group of logic. It is the client's code which contains the behavior, not the container of logic (specifically, it is the client defined tasks which exhibit the behavior derived from the Implementation Directives). A range is a specified area of the physical chip.

The Behavior Manager is a software tool which centralizes the behavior of algorithms and tasks into one software entity. The Behavior Manager can use data (implementation directives and properties) contained in an I-Set to determine the behavior of tasks and algorithms.

Figure 2:
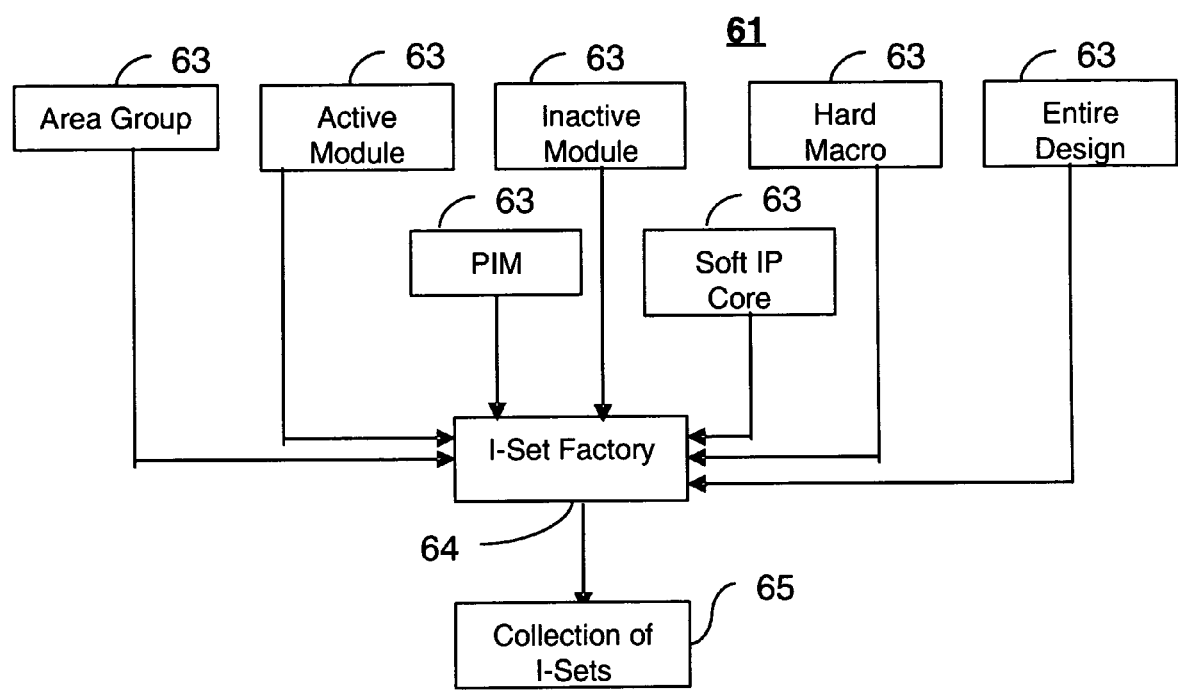
FIG. 2 is a block diagram illustrating how an I-Set factory uses one or more net-list entities as inputs and applies a predefined mapping to create a collection of I-Sets in accordance with one embodiment of the inventive arrangements disclosed herein.

In order to provide a singular representation of a partial net-list, a construction mechanism, referred to as I-Set factory, is introduced. An I-Set factory is shown in FIG. 1 as part of an overall I-Set scheme 50 for creating circuit designs and in a narrower setting 61 in FIG. 2 illustrating the creation of a collection of I-Sets 65. Referring to FIG. 1, an I-Set Factory 54 in an overall scheme 50 for implementing an integrated circuit design 51 is shown receiving a plurality of inputs 52 such as command line variables, environment variables, and constraint files. The I-Set factory 54 can maintain the integrated circuit design hierarchy in an I-Set hierarchy construction 53 and introduce additional I-Set hierarchy that is suitable for a particular implementation flow or a particular design tool and further assigns directives at block 55 in the process of producing a collection of I-Sets 56 which has the I-Set hierarchy annotated with directives which are used by client software 59. In conjunction with a behavior manager 58 and the client software 59 (such as circuit design tools), a list of tasks 57 can be generated from the directives which are associated with the collection of I-Sets. Note, there are some instances where the client software 59 can communicate directly with the I-Set factory 54 to perform similar functions. Finally, the client software 59 can either direct the execution or execute the tasks on the collection of I-Sets at block 60. Note that an I-Set abstraction can be created using the I-Set factory 54 as a single module in an implementation tool flow process performing both implementation set hierarchy construction (53) and implementation set directive assignment (55). Further description of the I-Set factory and I-Sets is found in concurrently filed, co-pending, commonly assigned U.S. patent application entitled, METHOD AND ARRANGE- MENT PROVIDING FOR IMPLEMENTATION GRANULARITY USING IMPLEMENTATION SETS, by Raymond Kong et al., which is incorporated by reference herein. The behavior manager 58 solves the problems associated with distributed rules by isolating them in one place. The behavior manager 58 determines the behavior of the clients (59) and further communicates or interfaces with the functions of generating a list of tasks (57) and executing (60) such tasks. The client provides the behavior manager 58 with the logic container, and the behavior manager 58 determines the behavior by applying a single set of rules to runtime and static data. The rules determining the behavior are encapsulated in the behavior manager 58. Any changes to the required behavior are easily made by changing the code in the behavior manager 58, not in the client code. The amount of code required can thus be reduced overall, and maintenance made much simpler.

As the number of implementation directives increase in order to add new levels of control over client software, the level of complexity that each client must address increases. The behavior manager 58 reduces the complexity for all clients by providing a centralized mechanism to handle and process the implementation directives. Clients can then focus on simple behaviors, rather than complex rules that govern the behavior.

The behavior manager 58 is capable of maintaining and enforcing precedent rules, resolving conflicting rules, and simplifying error handling. Furthermore, the behavior manager 58 can act as a simple interface to desired behavior with a symbolic form, string or number. Different clients using the behavior manager 58 with the same set of conditions are guaranteed the same results and can avoid the duplicative debugging of code for one or more clients. The behavior manager 58 returns the same results based on the same input data and behavior that is requested. The behavior manager is further described in commonly assigned, concurrently filed patent application entitled, METHOD AND SYSTEM FOR MANAGING BEHAVIOR OF ALGORITHMS by Daniel J. Downs et al., which is herein incorporated by reference.

Referring once again to FIG. 1, a design tool for designing integrated circuits using implementation directives for flow control can include an interpreter (such as the I-Set Factory 54) for interpreting flow data from at least one among a command line, constraint files, and environment variables to form a data model, a decomposer (53 and 55) for decomposing the flow data into directives, and a task manager (57) for creating a set of tasks associated with each of the plurality of partial netlists that operate on the logic of the partial netlists. The task manager 57 can be created by an individual point tool (such as client software 59) and can create a list of tasks or functors based upon the implementation directives associated with the partial net-list. The set of tasks are ideally small well defined flow independent tasks. The design tool can further include a generic flow engine 69 for calling the tasks for each of the plurality of partial netlists. Note, the directives can be individually associated with each of a plurality of partial netlists forming a design and are independent of a flow from the generic flow engine 69. The design tool can further include a data file (such as the Guide I-Set 66 discussed below) used to set default flow implementation directives. The design tool can also be enabled to re-use tasks among multiple point tools or software clients.

The generic flow engine 69 can include a base I-Set 62 of the original IC design 51 that uses the Guide I-Set 66 to transform directives to tasks or functors and to further annotate the tasks. As each node is visited in the process, a generic interface 68 is called to execute the specified tasks on the I-Sets. Note that the generic flow engine 69 can just include the generic interface 68 in one embodiment. In this manner, once a design is loaded along with the user-specified constraints, the I-Set Factory 54 creates an instance of an I-Set for each partial netlist, complex high level rules are decomposed into simple implementation directives, and the simple directives are attached to each I-Set as needed. As tools operate on the partial netlists, the point tool can attach more implementation directives as needed and allow a point tool to communicate with downstream point tools while preserving state information for future runs. Also, each partial netlist can contain a different set of tasks. For instance, one netlist may have elements that need to be locked to a particular set of sites on the chip, whereas another netlist may contain elements that should be implemented as needed with each pass of the tool. The use of tasks allows the point tools to easily treat the partial netlists in a heterogeneous and flexible fashion.

As a simple example of FIG. 1, after the I-set tree having I-set nodes, is built, each I-set node is traversed to assign tasks based on information such as command line options, a constraints file such as a user constraint file (UCF), implementation directives, and environment variables. Examples of environment variables include: XIL_GUIDE_MEMORY_BLOCKS=[TRUE | FALSE], if TRUE, then a guide task will guide memory blocks and XIL_GUIDE_CONTEXT_LOGIC=[TRUE | FALSE], if TRUE, then a guide task will guide context logic.

An example of an implementation directive is: "IST_GUIDE_SIGNALS={TRUE | FALSE}". This directive will perform the task of guiding signals (i.e., re-using signal data from a guide file in a current design), if the directive is TRUE. The following execute functor pseudo code illustrates the task performed:

```
bool BAS_GI_TASK_SIGS::execute(GI_ISET *iset)
{
    // Quick check to make sure we should be guiding the
signals
    if( !iset->Check_IST_GUIDE_SIGNALS_DIRECTIVE( ) )
        return TRUE;
    Create new report object;
    For Each Signal
    {
        Align pins;
        Get Corresponding signal from current Design;
        Transfer guide signal data to current design
signal;
        Update report object;
    }
return TRUE if there were no problems, FALSE otherwise;
```

An example of a non-guide directive is the lock_blocks directive. If the environment variable ENVIRONMENT_VARIABLE_LOCK_BLOCKS=TRUE and the lock_blocks directive is TRUE, then the associated task will lock the block(s) on the appropriate I-Set node in the current design. The pseudo code for the task is:

```
Load DEFAULT_LOCK_BLOCKS boolean from an input file;
for each input iset node (N)
{
    if( ENVIRONMENT_VARIABLE_LOCK_BLOCKS == TRUE )
    {
        Load LOCK_BLOCKS_TASK;
```

```
        } else{
            // Check to see if the lock_blocks directive is set
on N
            if( N->Is_Lock_Blocks_Set )
            {
                boolean lock_blocks = N-
>Get_Lock_Block_Setting( );
                if( lock_blocks == TRUE )
                {
                    Load LOCK_BLOCKS_TASK;
                } else {
                    Load UNLOCK_BLOCKS_TASK;
                }
            } else {
                // Since the lock_blocks directive was not set,
                // leave locks on the blocks untouched
            }
        }
    }
}
```

The directives can come from several places to include: a separate file, environment variables, the command line or they may be a hardcoded default task. There is a priority by which a default directive may be overridden by a directive read in from a file. In the following example, if an environment variable called "ENVIRONMENT_VARIABLE_GUIDE_ALL_OR NOTHING" is set to TRUE, then one type of task is loaded. The environment variable has the highest priority. If the directive REUSE_ALL_RESULTS is found in an input file, and is set to TRUE, then a different task is loaded. Finally, if neither of the first two directives are found, then the default task is used. In this example the REUSE_COMP_RESULT_TASK may be selected by the code directly as it is hard coded into the program. The pseudo code for the example is:

```
Load REUSE_ALL_RESULTS boolean from an input file;
for each I-Set node
{
    if( ENVIRONMENT_VARIABLE_GUIDE_ALL_OR_NOTHING == TRUE
)
    }
        Load GUIDE_ALL_OR_NOTHING_TASK;
    } else if( REUSE_ALL_RESULTS == TRUE )
    {
        Load REUSE_ALL_RESULTS_TASK;
    } else {
        // HARD CODED RESULT
        // Use the default task:
        Load REUSE_COMP_RESULTS_TASK;
    }
}
```

In summary, each software client implements a task manager, which in turn queries the I-Set node and creates a list of tasks to be performed on the container. Once all containers in the I-Set tree have the appropriate set of tasks associated with them, a generic flow engine (68) executes the list of tasks for each container. If a flow is changed, a different set of implementation directives will exist for the containers, and the task manager creates a new set of tasks to be performed rather than having to change code in one or more of the software clients. These underlying tasks are insulated from any flow change. Instead, any new required behavior is established with a different set of tasks. The tasks are independent of the high-level flow information, and can be very specific in nature. By creating small, specific tasks, they are easily shuffled and reused to create lists that reflect changes in flow requirements. Variations of flows are also possible without any algorithmic changes. Note that although the implementation directives and tasks have been described as being associated with each I-Set or container, other alternatives where the implementation directives and tasks could be stored in separate but related containers can also be used. The generic flow engine could also be implemented in the actual container.

Across each software flow (or prior existing flows), the I-Set factory is invoked to transform the appropriate net-list entities into a collection of I-Sets. The partial net-information of an I-Set is controlled by the mapping strategy chosen for the factory, either 1-to-1 or 1-to-many. Referring to FIG. 2, the various existing net-listing entities 63 (such as Area Group, Active Module, Inactive Module, Hard Macro, Entire Design, PIM, or Soft IP Core) can be inputs into an I-Set Factory 64 which applies a pre-defined mapping in producing the collection of I-Sets 65. If a 1-to-1 mapping is chosen, then the I-Set factory does not require any user input and automatically generates the appropriate collections of I-Sets driven by the current software flow. On the other hand, if a 1-to-many mapping is used, then the I-Set factory can take user input and use it to customize or override internally generated I-Set collections. Also, it follows that the latter provides the most flexibility in producing I-Sets of varying implementation granularities.

With the introduction of I-Sets, the overall software effort and impact can be significantly minimized. Client applications no longer need to incur the software overhead needed to support the various and increasing number of design entities. In addition, the effort to support the growing list of net-list entities can be substantially reduced by supporting a single abstraction, namely, the I-Set. The methods disclosed herein can be implemented by a software-based circuit design tool that can receive, pack, place, and route a circuit design representation. As is known, placing refers to assigning components of a circuit design to physical locations on a chip and routing refers to routing signals, or forming connections, between components of the circuit design.

Figure 3:
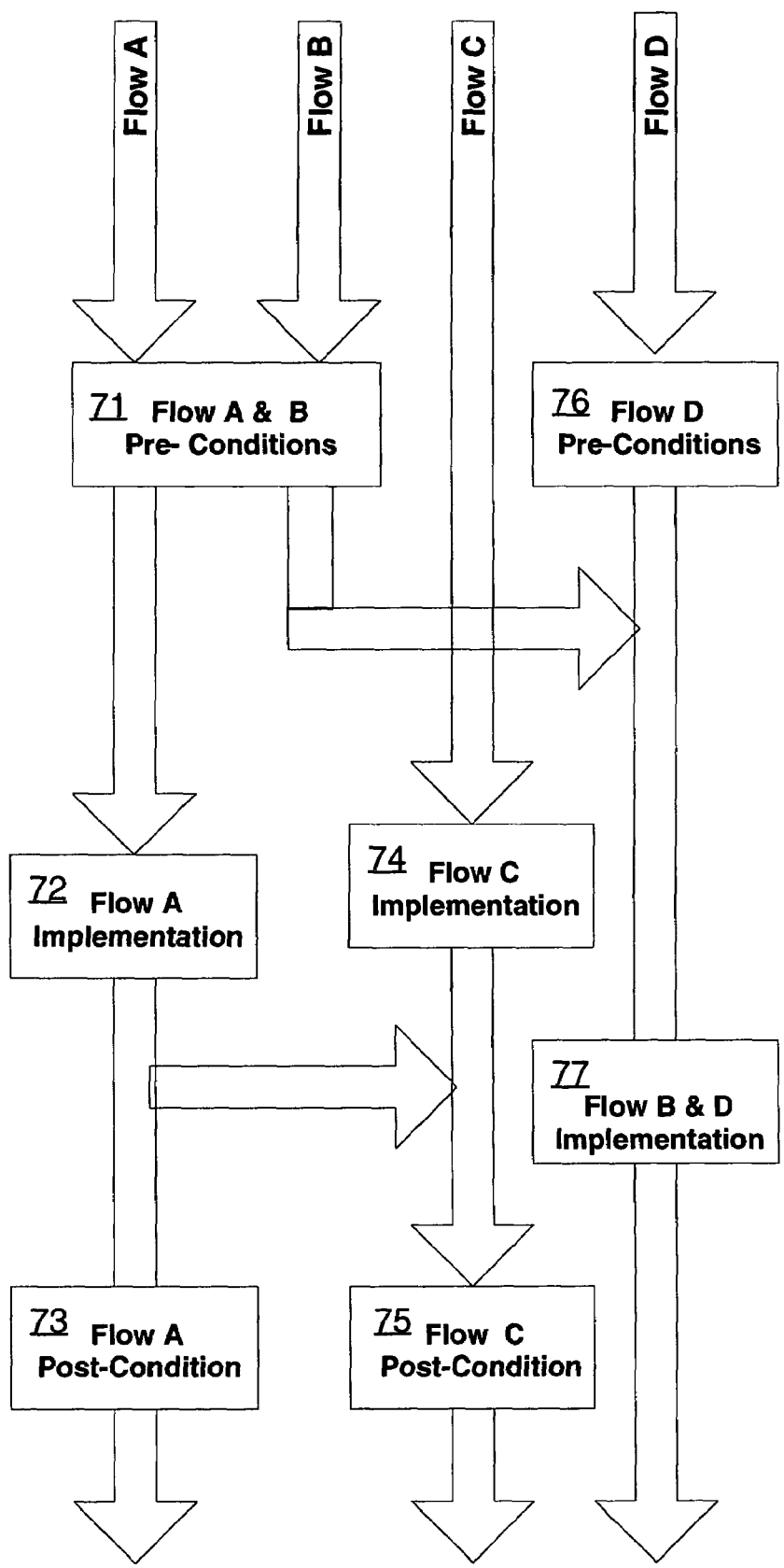
FIG. 3 is a flow diagram illustrating the fractured nature of existing implementation methods.

The flow diagram of FIG. 3 illustrates a simple example 70 where each flow has a different starting point and ending point in an algorithmic flow of Physical Guide. For example, Flows A & B with preconditions 71 have similar starting points, but due to flow specific controls, the ending point for Flow B is separate and distinct from Flow A. Flow A flows through algorithm 72 and post condition 73 while Flow B flows through algorithm 77. Conversely, Flow C has completely distinct starting and ending points in the application flow and control algorithms via algorithm 74 and post condition 75. Flow D flow through pre-condition 76 and algorithm 77 as shown.

The fractured implementation shown in FIG. 3 has several disadvantages and limitations. For instance, flow implementations are inflexible to flow changes, including the addition of new implementation flows and modifying existing implementation flows. In this regard, flows can not be mixed or leveraged from each other and hence limit the degree of design re-use. Furthermore, the software is not robust and difficult to maintain and the algorithms are dependent on flow information and partial net-list representations.

Embodiments in accordance with the present invention overcome the challenge of finding a way to unify the implementation of differing interactive flows in an independent manner. Physical Guide, the existing guide engine, was dependent on each flow and required significant software overhead to process each flow represented by a partial netlist of the entire design. Various design entities such as hard macro, soft IP core, and RPM added more complexity to the algorithmic flow. Each of these design entities were also implemented and supported separately for each interactive flow. Using Physical Guide as a model in one embodiment, the notion of Implementation Sets (I-Sets) can be used as a way to provide a flow independent solution. I-Sets enables a unified means of implementing each partial net-list. Physical Guide no longer needs to distinguish area groups or user floor-planned partitioning, modules, and flat designs in its implementation as it is solely based on I-Sets.

Figure 4:
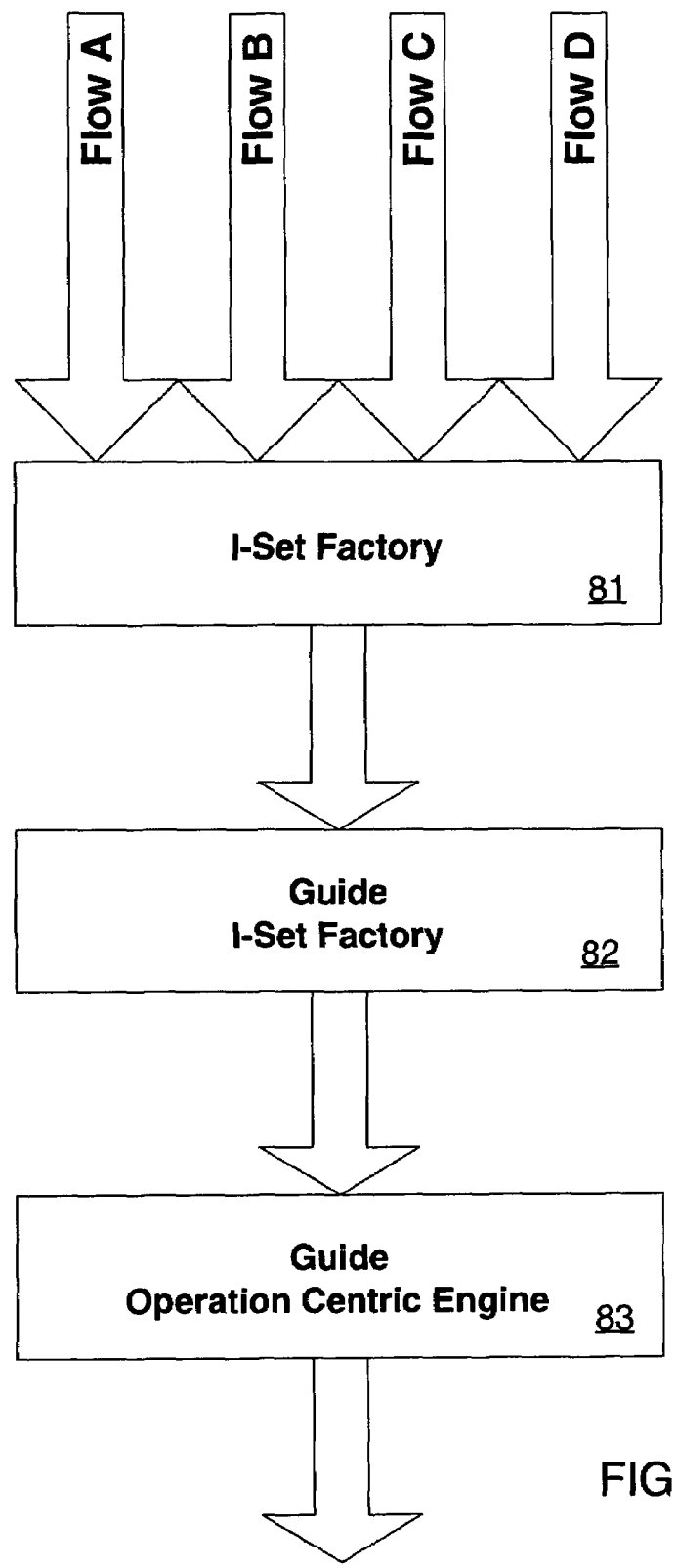
FIG. 4 is a flow diagram illustrating the simplified nature of an implementation method in a unified physical guide engine

In order to apply I-Sets to the Physical Guide engine, a way to unify the flow specific controls that were specific for each interactive flow needed to be identified. It was determined that each of these flow specific controls could be applied to any flow and also combined/mixed together to provide flow solutions in a generic fashion. Through this determination, it was further discovered that each flow specific control can be converted into a generic task. Thus, a flow diagram 80 of FIG. 4 illustrates a simplified paradigm where all flows can be handled by an I-Set factory 81 using a Guide I-Set factory 82 and a Guide Operation-centric Engine 83 to provide Physical Guide unification.

The notion of applying the generic tasks to I-Sets based on characteristics on each I-Set node is being introduced as way to algorithmically provide Physical Guide unification. These characteristics are comprised of properties that are deposited on the I-Set based on a combination of implementation granularity, user directives and run-time environment variables. Each task that is generated is deposited on that I-Set node as a data operation (using the Guide I-Set factory 82) A further notion of creating point tool representations of I-Sets can also be used herein to apply directives to specialized I-Set representations as well as additional characteristics based on a generic I-Set model. The tools can understand these directives and the appropriate operations are applied to each I-Set node based on each directive. This mechanism provides the Guide processing a way to divide each dependent interactive flow solution into independent and separate problems. The Guide engine exploits this paradigm by providing generic interfaces and recipes for reuse of partial net-lists.

The Physical Design Guide or the "Par-Guide" application herein provides a mechanism to implement partial net-lists via a set of operations that can be applied to each net-list. With the introduction of I-Sets, the overall software effort and impact is significantly minimized. Client applications, such as Par-Guide, no longer incur the software overhead needed to support the various and increasing number of interactive flows because the original problem to be solved is broken down into smaller and independent tasks simplifying and unifying each flow within the point tools.

An operation-centric generic Par-Guide process provides an independent and separate solution that takes an original problem that was flow dependent and fractured in implementation and provides a solution that is flow independent. Of course, this concept can be extended to other point tools such as the logical guide engine and the graphical editor. In each of these point tools, a generic, independent and simplified interface is provided to reduce run-time and algorithmic complexity while bringing to market new and more complex interactive flows.

A set of Guide I-Set recipes are formulated such that the unification of design entities such as active module, area group or user floor-planned partitioning, and flat design can be implemented independent of having knowledge of these design entities. This provides a generic implementation for any interactive flow. Subsets of these recipes are then applied to each I-Set entity representing a partial net-list implementation.

The generic implementation can be taken one step further. In this step, we can adopt the concept of the behaviors. Within each directive, pre and post condition checks can be made based on implementation directives that are found within each I-Set node. Using this model, the problem to be solved can be broken down into smaller granules while continuing to support each interactive flow in an independent manner.

Referring once again to FIG. 4, an illustration of how user specified interactive flows are handled in the point tools utilizing the operation-centric paradigm is shown. In an algorithmic implementation, the I-Set factory 81 is leveraged in a first step to create a representation of the implementation granularity that can be called the "base" I-Set (see also 62 in FIG. 1). The physical guide engine in a second step makes use of its own internal I-Set factory. For purposes of this illustration, this is called the "Guide" I-Set factory 82 (see also 66 in FIG. 1). The Guide I-Set factory 82 creates a single abstraction 90 of the implementation hierarchy (base I-Set) as seen by Guide and illustrated in FIG. 5. Unlike the base I-Set tree, the Guide I-Set tree (90) may be a transient I-Set tree and is not necessarily stored persistently in the design database. It is then the responsibility of the Guide I-Set factory 82 to deposit directives and properties on each Guide I-Set node.

The Guide I-Set tree is in effect an annotated I-set tree, where the annotations are the Properties and Directives. The pseudo code for a portion of the Guide I-Set Factory in one embodiment of the present invention is:

```
LoadDesign ( );
if( user_defined_hierarchy == TRUE )
{
    For Each User Defined Group Of Logic
    {
        Create a new ISet;
        Load Signals and Components into new ISet;
        Load Properties and Directives into Each new ISet;
    }
} else {
    Create a Single ISet;
    Load Signals and Components into the new ISet;
    Load Properties and Directives into the New ISet;
}
```

Properties are basically human readable information about ISets. For instance, if a guide file is associated with a particular I-Set, then the guide file name is stored as a property in that I-Set. Implementation directives, i.e., directives, are pre-defined words that direct algorithms to operate one way or another. Directives are stored as properties. For example "IST_GUIDE_ALL_OR_NOTHING={TRUE | FALSE}" is a directive (that forces the guide tasks to guide all of the components and signals, and if it's not possible, to guide none of the components and signals) that is stored as a property.

The directives select a set of tasks that are to be performed on a particular partial net-list, i.e., I-Set node, by the point tool, for example the ISE tool from Xilinx, Inc. A directive represents the attributes of that particular partial net-list. These directives are determined by the given design entities, such as implementation hierarchy, properties and user influenced settings that are defined on each I-Set node. The associated one or more tasks can be represented in C++ object oriented code as functor(s).

Thus when the Guide I-Set factory 82 annotates the I-Set nodes with directives and properties, the Guide I-Set factory 82 can also, in one embodiment of the present invention, annotate the I-Set nodes with the associated tasks, for example, functors (creates a Guide I-set tree).

Conceptually, the Physical Guide Engine can utilize a common function interface (see 68 in FIG. 1) that has varied underlying implementations that supports a number of interactive flows. The engine can support adding or modifying flow behaviors by adding, changing or removing directives providing a flow independent implementation.

Furthermore, embodiments in accordance with the present invention can exploit the notion that each task is a formulated recipe that manipulates the partial net-list in a consistent manner without knowledge of flows, properties and user influenced settings. In a third step 83, the physical guide engine then processes the guide I-Set tree. The guide I-Set tree processing can be performed in either a bottom up or top down manner. As each node in the guide I-Set tree is visited, each task deposited on Guide I-Set is invoked. Within each recipe, varying degrees of behaviors may be observed and provide a finer implementation granule.

The Guide Operation Centric Engine 83 (see also step 105 of FIG. 6) thus executes the tasks on the annotated I-Set tree (i.e., the Guide I-Set tree). The Guide Operation Centric Engine 83 can be represented by the following pseudo-code:

```
For each Guide I-Set Node
{
    For Each Task
    {
        Execute Task;
    }
}
```

Many of the algorithmic benefits found within the third step 83 can include:

1. An implementation interface within the Physical Guide engine that can be made flow independent. Each task can operate on the same data structure, such as the I-Set implemented in a flow independent, consistent, and unified manner.

2. A reduction in code complexity such that operations (or tasks) can operate independent of any user interactive flow.

3. Complex implementation flows are easily implemented in a simplified manner such that the directives applied to an I-Set for one particular flow can be leveraged to implement a portion of a different flow without any algorithmic changes required.

4. The mixing of various interactive flows is possible on a partial net-list. Using FIG. 5 as an example, one set of directives may be applied to D' while a completely different set of directives may be applied to E'. It further follows that a mixture of directives may be further applied to C'.

5. Prior knowledge of the intended design or implementation granularity is not required, thus insulating the user-defined implementation from the actual algorithmic solutions providing the best quality of results.

6. Run-time is not sacrificed, but rather reduced since the internal algorithmic implementations are no longer fractured. Nested and sometimes complex conditional constructs combined with the various flavors of implementation flows are eliminated. These constructs can be replaced with a simple monolithic interface that operates on functors that are deposited on each node in the I-Set tree, as shown in FIG. 5.

Embodiments in accordance with the invention can further include support for any point tool where the original problem is simplified into smaller independent instances. This scheme can reduce run-time, particularly as FPGA designs become more complex, such that the notion of parallelism can be applied to implementing each independent problem concurrently. For Instance, as shown in FIG. 5, directives could be applied concurrently to both node D', F', and C' rather than applying the directives in a serial manner.

Figure 6:
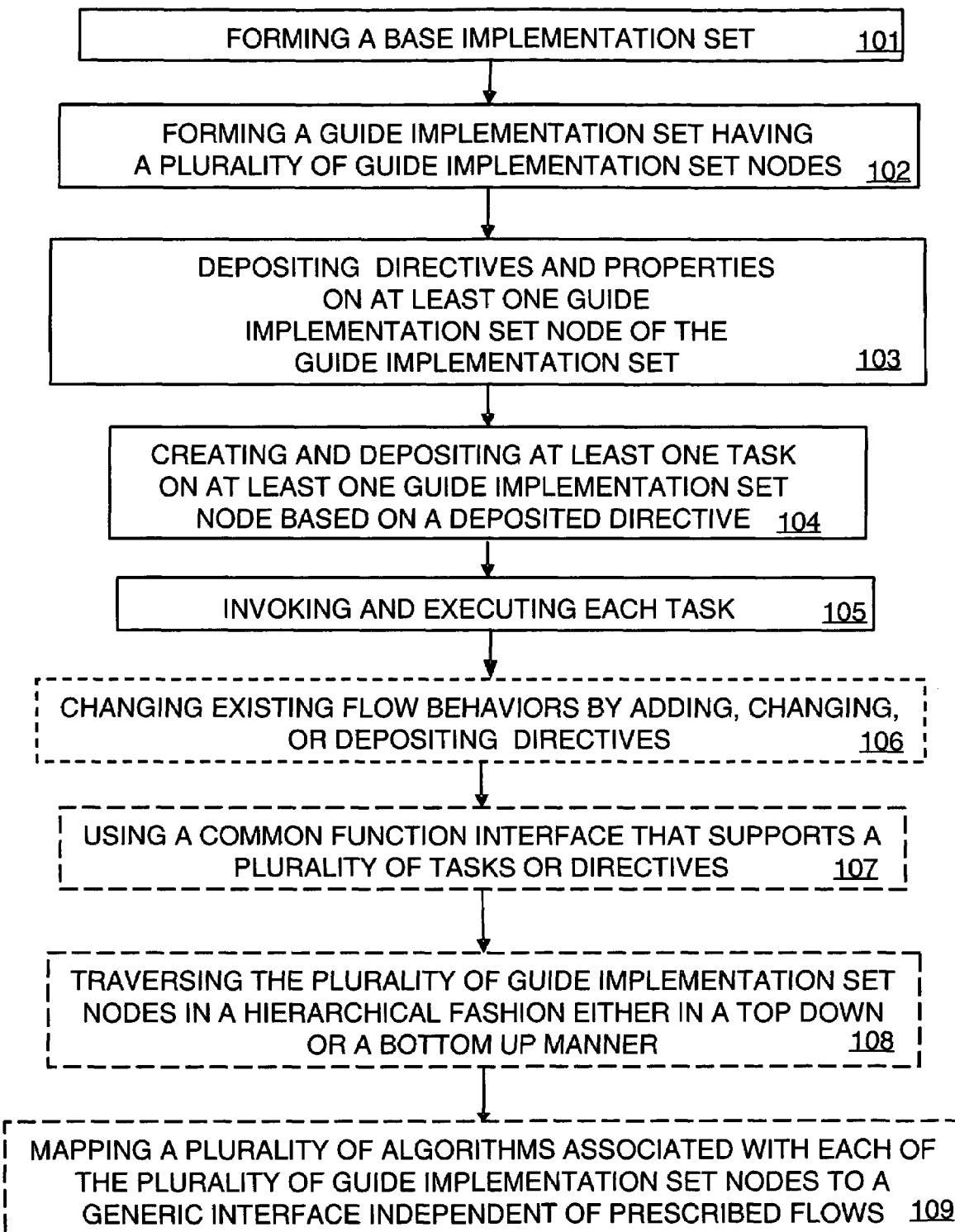
FIG. 6 is a flow chart illustrating a method of implementing integrated circuits in accordance with an embodiment of the inventive arrangements disclosed herein.

In one embodiment as shown in the flow chart of FIG. 6, a method 100 of implementing an integrated circuit design can include the steps of forming a base implementation set at step 101 and forming a guide implementation set having a plurality of guide implementation set nodes at step 102. The method can further include the steps of depositing directives and guide related characteristics on at least one guide implementation set node (or each node) among the plurality of guide implementation set nodes at step 103 and creating and depositing at least one task on at least one guide implementation set node based on a deposited directive (step 104). In one example, each guide implementation set node has a directive deposited on it. A task is then created and deposited on each guide implementation set node depending upon the directive on that node. At step 105 each task is invoked and executed. The plurality of guide implementation set nodes can be traversed in a hierarchical fashion (bottom-up or top-down) as shown at step 108. Also, existing flow behaviors can be changed at step 106 by adding, changing, or removing operation directives. A common function interface can be used at step 107 to support a plurality of tasks or directives. More particularly, a plurality of directives associated with each of the plurality of guide implementation set nodes can be mapped to a generic interface independent of prescribed flows at step 109.

Steps 101 to 104 of FIG. 6 can be implemented by the following pseudo-code of one embodiment of the present invention:

```
For each I-Set Node (N) in the current design
{
    Create a specialized Guide I-Set (M) based on node N;
    Assign directives to M;
    Create generic guide tasks, T;
    For each Guide I-Set node (M)
    {
        Assign to M component and signal name matching
task;
        Assign to M signal matching task;
        Assign to M component assignment task;
        If (routing is guided)
        {
            Assign to M the task of signal assignment;
            Assign to M the task of signal matching
based on component information;
        }
        If (M has implementation directive equal to
"IST_GUIDE_IF_NO_CHANGE")
        {
            Assign to M the task of incremental guiding;
        }
        If (M has implementation directive equal to
"IST_GUIDE_VCC_GND_NETS")
        {
            Assign to M the task of guiding VCC/GND
signal;
        }
        If (M has implementation directive equal to
"IST_IGNORE_PORT_NETS")
        {
            Assign to M the task of ignoring the guiding
of port signals;
        }
        Assign to M the task of guiding between current
and guide files;
    }
}
```

An example of a guide file is a binary Native Circuit Description (NCD) file produced from running an original design through the ISE 6.2I software design tool from Xilinx, Inc. of San Jose Calif. More particularly the NCD file is the output of the Place and Route portion of the ISE tool. The NCD file is further described in the "Development System Reference Guide," UG000 (v3.5.1) Apr. 30, 2003, from Xilinx, Inc. and also found in an updated version on the Internet at http://toolbox.xilinx.com/docsan/xilinx6/books/data/docs/dev/dev0001_1.html). When the original design is modified, for example, changing a few pieces of logic but leaving the bulk of the design unchanged, the guide file is used in running the modified design through the ISE tool to assist in re-using the results from the previous run when possible.

In other embodiments a guide file is the output of any commercial place and route tool of a previous design. The purpose of the guide file is to allow re-use of unmodified parts of the previous design in the current design. While the ISE tool is given as an example of a point tool, other commercial computer aided design tools may be used.

In one embodiment a primary guide technique is name matching. The method starts with a component ("comp") or signal in the modified design file, and looks for a component or signal in the guide file (the NCD created from the previous, e.g., original design, run through the tools) with the same name. The method then creates a "match" object to designate that the two components or signals with the same name exist. This name matching allows re-use of much of the guide file information (e.g., reuse of some, if not many, partial netlists in the NCD file from the previous design) in the NCD file created from the current modified design file.

Hence, in one embodiment of the present invention, there is a name checker task for comparing signal and component names in a current design with signal and component names in a guide design or file (NCD file from a previous design) in order to re-use at least one previous design partial netlist.

Figure 7:
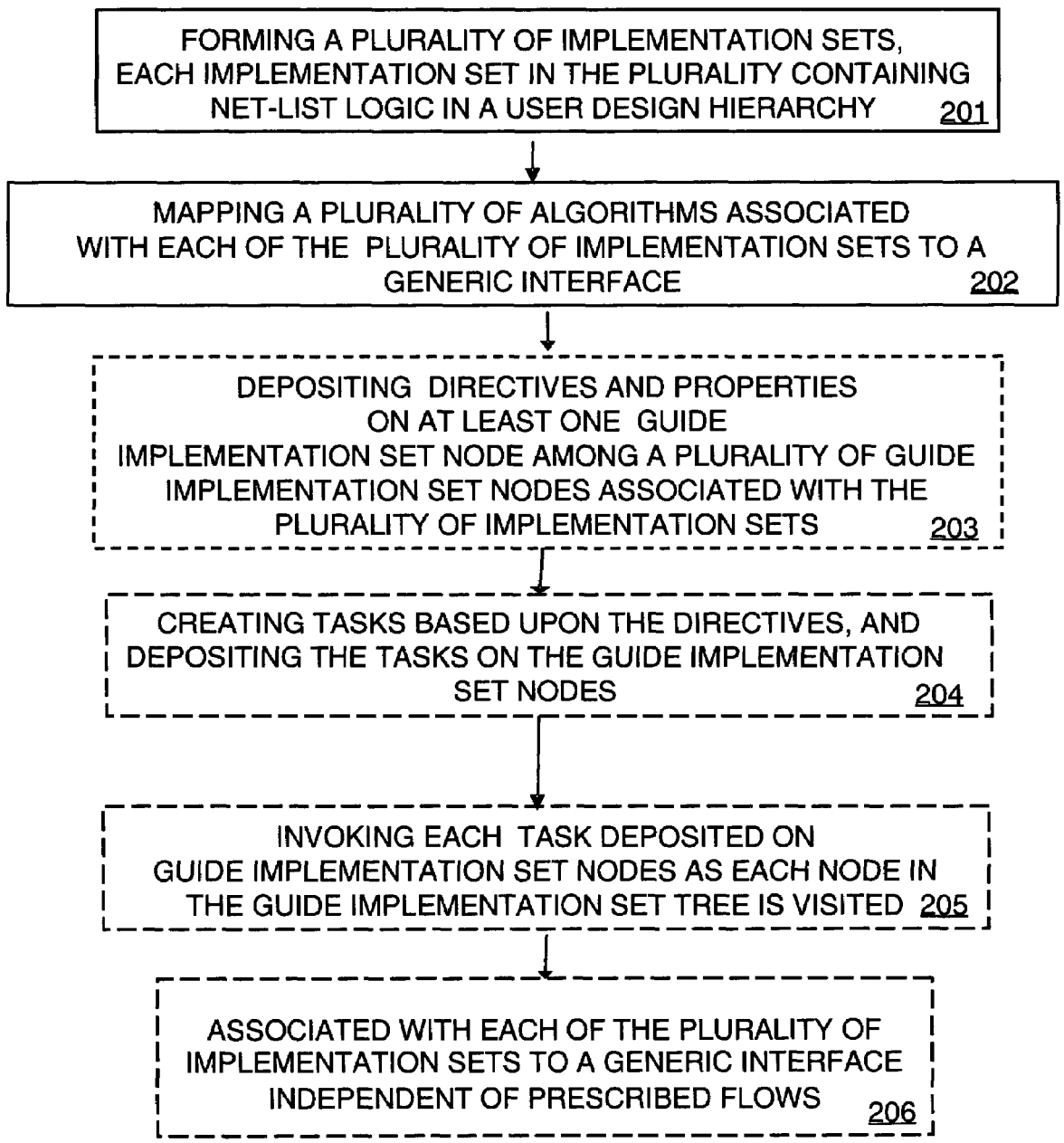
FIG. 7 is a flow chart illustrating a method of implementing integrated circuits in accordance with another embodiment of the inventive arrangements disclosed herein.

In another embodiment as shown in the flow chart of FIG. 7, a method 200 of implementing an integrated circuit design can include a step 201 of forming a plurality of implementation sets (each implementation set in the plurality containing net-list logic in a user design hierarchy) and mapping at a step 202 a plurality of directives associated with each of the plurality of implementation sets to a generic interface which can be independent of prescribed flows as further illustrated at step 205. The method 200 can further include a step 203 of depositing directives and guide related characteristics on at least one guide implementation set node among a plurality of guide implementation set nodes associated with the plurality of implementation sets. The method 200 can further include a step 204 of creating tasks based upon the deposited directives, and depositing the tasks on the guide implementation set nodes and a step 205 of invoking each task deposited on guide implementation sets nodes as each node in the guide implementation set tree is visited.

Figure 8:
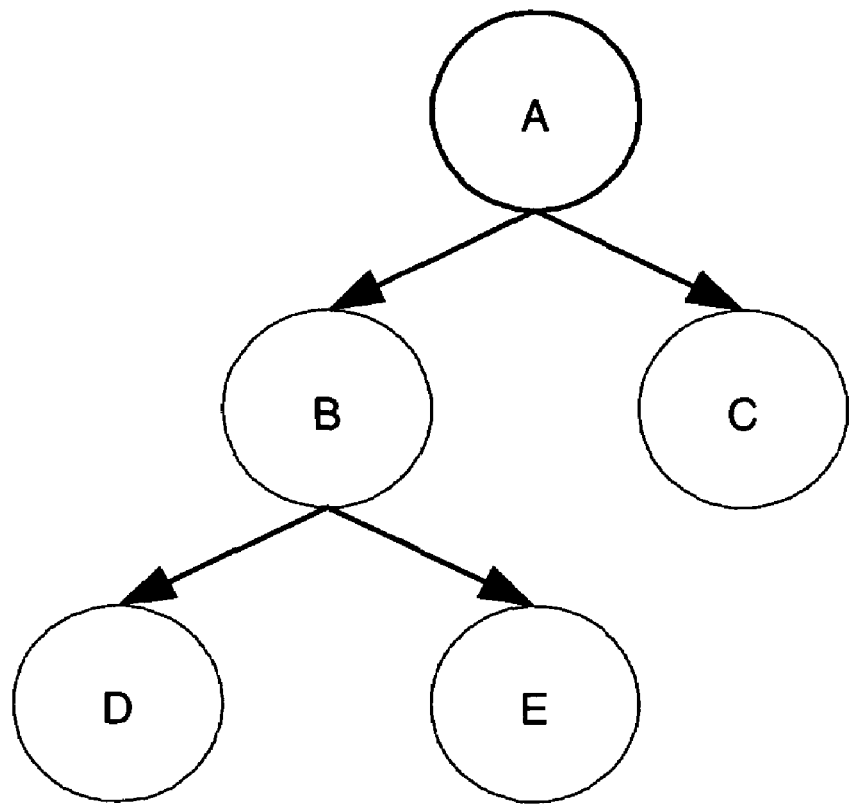
FIG. 8 is a simplified example of an I-Set tree of a first design.

To illustrate an exemplary embodiment of the present invention, FIG. 8 is a simplified example of an I-Set tree of a first design 300. The I-Set tree is the netlist for the first design. Each of the I-Set nodes A–E, represent a partial netlist of the complete netlist for the first design. This first design is then run through a point tool such as ISE from Xilinx, to produce a guide file (e.g., Xilinx NCD file) from the place and route portion of the point tool. In another embodiment the guide file is produced directly from the first design and there is no I-Set tree produced for the first design 300.

Figure 9:
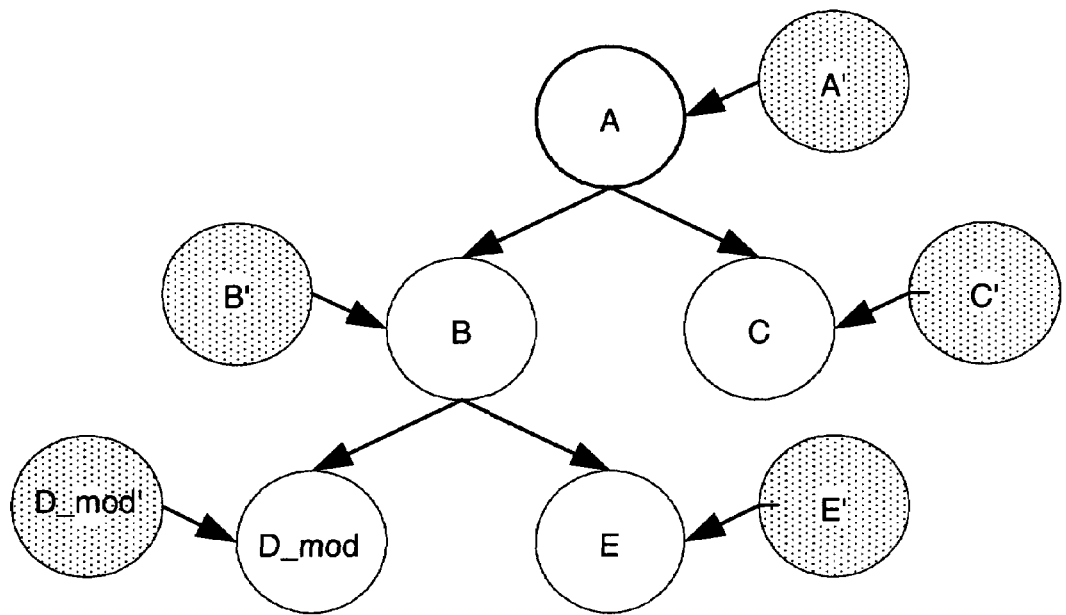
FIG. 9 shows an I-Set tree for a second design, where the second design is a modification of the first design.
Figure 10:
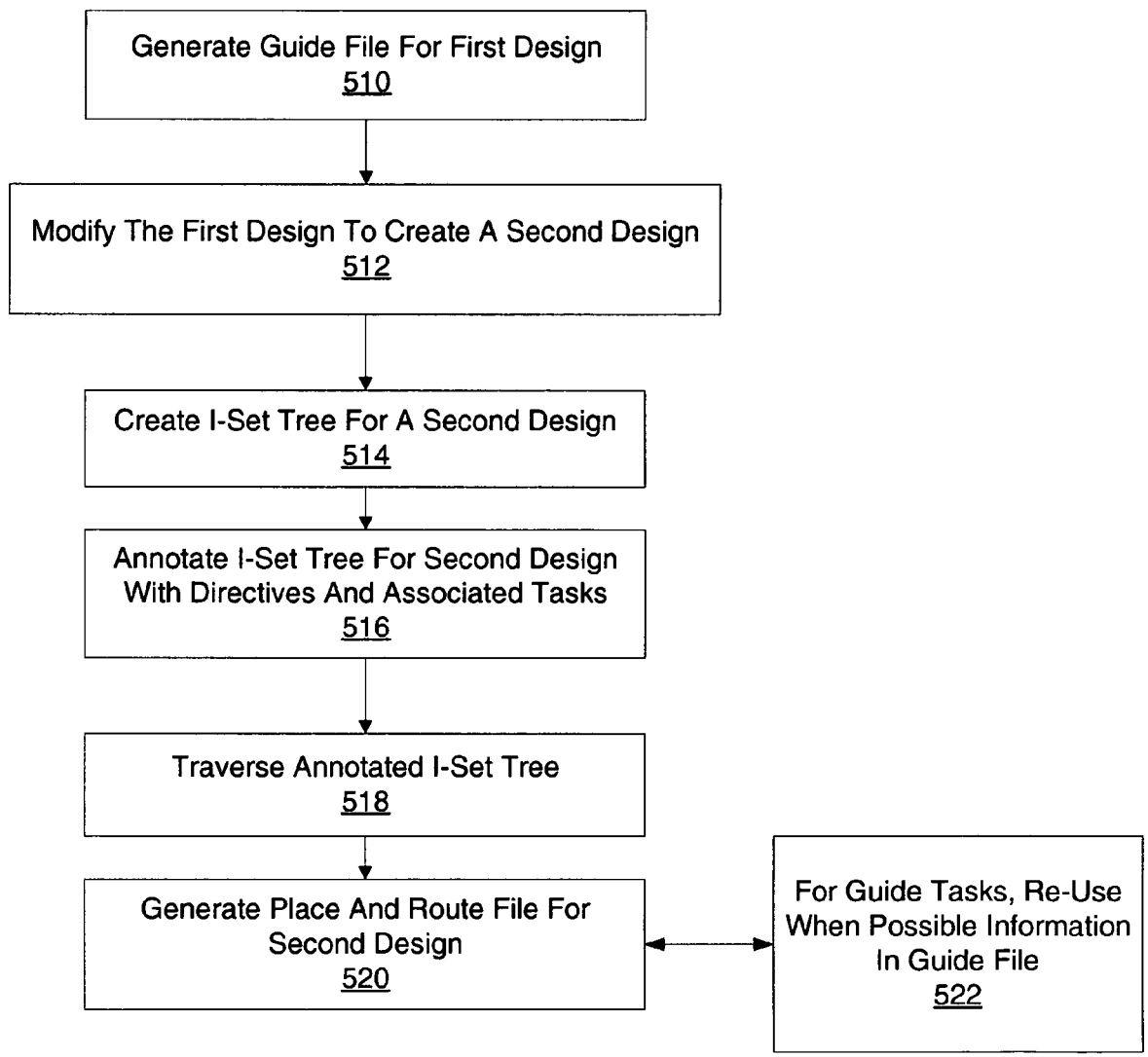
FIG. 10 is a simplified flowchart of generating a place and routed netlist of a second design from a place and routed netlist of a first design of an embodiment of the present invention.

To continue with the simplified illustration, FIG. 9 shows an I-Set tree for a second design, where the second design 400 is a modification of the first design 300. The second I-Set tree differs from the first I-Set tree in that node D has been modified, i.e., D_mod. The other nodes A, B, C, and E are the same in FIGS. 8 and 9. The D-Mod node indicates that only the partial net-list in node D of first design 300 has been modified.

The second design 400 I-Set tree has one or more of it's I-Set nodes A–E, annotated with directives and/or properties (indicated by the prime superscript A' to E'). For example node C is annotated by a directive, e.g., C', that "GUIDE_ROUTING" is true. Associated with this directive is a task to match and re-use any previous routing solution whenever possible, i.e., re-use the routing in node C of the first design 300 in node C of the second design 400. The directive and associated task form the Guide I-Set for node C of FIG. 9. The GUIDE_ROUTING task uses name matching to extract the routing information from the guide file created from the first design 300, i.e., comparing the routing names in the partial netlist in node C of the second design 400 with the partial netlist in node C of the guide file of the first design 300. The result is that most of the information in the guide file can be reused and only the modified partial netlist of node D need be run through the point tool to produce the new place and routed second design (e.g., new second design NCD file). In another embodiment the new second design NCD file is a second guide file which can be used for a third design and the process can iteratively continue to a fourth design and so forth.

FIG. 9 is a simplified flowchart of generating a place and routed netlist of a second design from a place and routed netlist of a first design of an embodiment of the present invention. At step 510 a guide file having a placed and routed netlist of the first design is generated from the first design. A modification is made to the first design to produce a second design (step 512). At step 514 the I-Set tree is created for the second design. The I-Set tree is annotated with directives and associated tasks to produce a Guide I-Set tree (step 516). The Guide I-Set tree is traversed and each one or more tasks associated with each Guide I-Set node is executed to generate the place and routed netlist for the second design (steps 518 and 520). For those guide directives, e.g., GUIDE_ROUTING, that have guide tasks, information in the guide file is re-used, when possible, in generating the placed and routed netlist for the second design.

Figure 11:
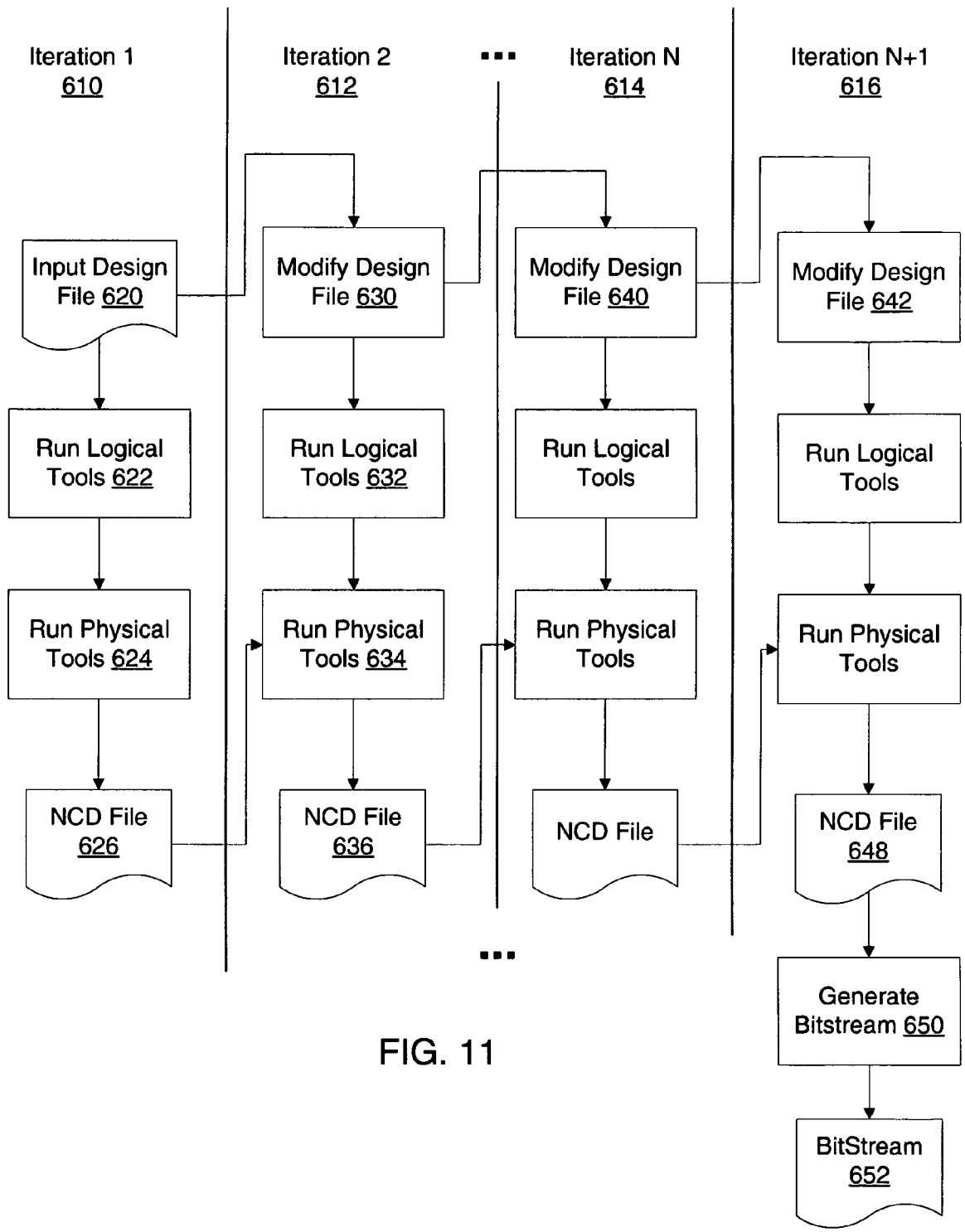
FIG. 11 is a multi-pass guide flow of an embodiment of the present invention.

FIG. 11 is a multi-pass guide flow of an embodiment of the present invention. The input design file 620 is a file which can be synthesized, for example a hardware description language (HDL) file. This input design file 620 is then used by a set of logical tools such as synthesis, ngdbuild, and map (step 622) and a set of physical tools, such as pack and place and route, (step 624) to produce an NCD file 626 in a first iteration 610. A second iteration 612 modifies the input design file 620 (step 630) and then runs the logical tools (step 632) and at step 634 runs the physical tools using the output of the logical tools in step 632 and the previous iteration NCD file 626 as a guide file to produce the second iteration NCD file 636. There may be N similar iterations, where N is an integer. In each iteration the input design in the previous iteration is again modified and the NCD file of the previous iteration is used as a guide file in the current iteration. In the last (N+1) iteration 616 the NCD file 648 is then used to generate bitstream 652 (step 650).

One embodiment of the present invention includes computer code stored in a computer readable medium, such as a computer memory, and operated on by a microprocessor, for generating a placed and routed netlist of a second design from a placed and routed netlist of a first design. The computer code includes: code for generating the placed and routed file, e.g., guide file, for the first design; code for creating a hierarchical tree of partial netlists, e.g., I-Set tree, for the second design, where the second design is a modification of the first design; code for annotating at least one node of the hierarchical tree with at least one task (e.g., creating a Guide I-Set tree); and code for executing the task to generate a portion of the placed and routed netlist for the second design. For tasks that are guide tasks, the code for executing the task may in addition, re-use when possible a potion of the information in the guide file.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of implementing an integrated circuit design, comprising the steps of:

forming a base implementation set;

wherein the base implementation set includes a plurality of base implementation set nodes, each base implementation set node corresponding to a partial netlist of the circuit design;

forming a guide implementation set having a plurality of guide implementation set nodes based on the base implementation set;

wherein each guide implementation set node annotates a respective base implementation set node;

depositing at least one of a plurality of directives on at least one guide implementation set node among the plurality of guide implementation set nodes;

wherein each of the plurality of directives controls selection of a task;

generating a respective list of one or more tasks for each base implementation set node based on the directive of the guide implementation set node that annotates the base implementation set node, wherein each task in the list operates on the partial netlist corresponding to the base implementation set node; and invoking each respective list of tasks as each base implementation set node is visited.

2. The method of claim 1, wherein the method further comprises the step of changing existing flow behaviors by adding, changing, or removing directives.

3. The method of claim 1, wherein the method further comprises the step of introducing a new user flow by defining a specific set of directives on at least one guide implementation set node among the plurality of guide implementation set nodes.

4. The method of claim 1, wherein the method further comprises the step of using a common function interface that supports a plurality of tasks or directives.

5. The method of claim 1, wherein the method further comprises the step of traversing the plurality of guide implementation set nodes in at least one among a hierarchical and a non-hierarchical fashion.

6. The method of claim 5, wherein the step of traversing is performed in a bottom up or top-down manner.

7. The method of claim 1, wherein the method further comprises the step of mapping a plurality of directives associated with each of the plurality of guide implementation set nodes to a generic interface independent of prescribed flows.

8. The method of claim 1, wherein the step of depositing comprises depositing directives on each guide implementation set node among the plurality of guide implementation set nodes.

9. An article of manufacture, comprising:

a computer-readable storage medium configured with computer code for generating a placed and routed netlist of a second design from a placed and routed netlist of a first design when executed by a computer, the computer code comprising:

code for generating the placed and routed file for the first design;

code for creating a hierarchical tree of partial netlists for the second design, wherein the second design is a modification of the first design;

wherein the hierarchical tree includes a plurality of nodes, each node corresponding to a partial netlist of the second circuit design;

code for annotating at least one node of the hierarchical tree with one of a plurality of directives, wherein each directive controls selection of a task;

code for generating a respective list of one or more tasks for each node based on the directive, wherein each task in the list operates on the partial netlist corresponding to the node; and code for executing each list of tasks to generate a portion of the placed and routed netlist for the second design as each node is visited.

10. The computer code of claim 9 wherein the code for executing the task to generate the portion of the placed and routed netlist for the second design comprises code to match the names of at least one of components or signals in the portion of the placed and routed netlist for the second design with names of at least one of components or signals in a portion of the placed and routed netlist for the first design.

11. The computer code of claim 10 wherein the portion of the placed and routed netlist for the second design is the same as a portion of the placed and routed netlist for the first design.

12. The computer code of claim 11 wherein the placed and routed file for the first design comprises a guide file.

13. A system for generating a placed and routed netlist of a second design from a placed and routed netlist of a first design, comprising:

means for generating the placed and routed file for the first design;

means for creating a hierarchical tree of partial netlists for the second design, wherein the second design is a modification of the first design;

wherein the hierarchical tree includes a plurality of nodes, each node corresponding to a partial netlist of the second circuit design;

means for annotating at least one node of the hierarchical tree with one of a plurality of directives, wherein each directive controls selection of a task;

means for generating a respective list of one or more tasks for each node based on the directive, wherein each task in the list operates on the partial netlist corresponding to the node; and means for executing each list of tasks to generate a portion of the placed and routed netlist for the second design as each node is visited.

* * * * *